(12) United States Patent
Starkston et al.

(10) Patent No.: US 10,716,214 B2
(45) Date of Patent: Jul. 14, 2020

(54) HYBRID MICROELECTRONIC SUBSTRATE AND METHODS FOR FABRICATING THE SAME

(71) Applicant: INTEL CORPORATION, Santa Clara, CA (US)

(72) Inventors: Robert Starkston, Phoenix, AZ (US); Richard C. Stamey, Portland, OR (US); Robert L. Sankman, Phoenix, AZ (US); Scott M. Mokler, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/771,774

(22) PCT Filed: Dec. 3, 2015

(86) PCT No.: PCT/US2015/063761
§ 371 (c)(1),
(2) Date: Apr. 27, 2018

(87) PCT Pub. No.: WO2017/095419
PCT Pub. Date: Jun. 8, 2017

(65) Prior Publication Data
US 2018/0343744 A1   Nov. 29, 2018

(51) Int. Cl.
*H05K 1/18*   (2006.01)
*H05K 1/11*   (2006.01)
(Continued)

(52) U.S. Cl.
CPC ............. *H05K 1/183* (2013.01); *H05K 1/115* (2013.01); *H05K 1/142* (2013.01); *H05K 1/18* (2013.01);
(Continued)

(58) Field of Classification Search
CPC ........ H05K 1/183; H05K 1/115; H05K 1/142; H05K 1/18; H05K 3/421
See application file for complete search history.

(56) References Cited

U.S. PATENT DOCUMENTS 7,030,494 B2   4/2006   Aoki
7,294,529 B2 *  11/2007   Tuominen ........... H01L 23/5389
                                                 257/E21.5

(Continued)

OTHER PUBLICATIONS

International Preliminary Report on Patentability for International Patent Application No. PCT/US15/63761, dated Jun. 4, 2018.
(Continued)

*Primary Examiner* — Nathan Milakovich
(74) *Attorney, Agent, or Firm* — Green, Howard & Mughal LLP

(57) ABSTRACT

A hybrid microelectronic substrate may be formed by the incorporation of a high density microelectronic patch substrate within a lower density microelectronic substrate. The hybrid microelectronic substrate may allow for direct flip chip attachment of a microelectronic device having high density interconnections to the high density microelectronic patch substrate portion of the hybrid microelectronic substrate, while allowing for lower density interconnection and electrical routes in areas where high density interconnections are not required.

21 Claims, 8 Drawing Sheets

(51) Int. Cl.
*H05K 1/14* (2006.01)
*H05K 3/42* (2006.01)
*H05K 3/00* (2006.01)

(52) U.S. Cl.
CPC ........... *H05K 3/421* (2013.01); *H05K 3/0035* (2013.01); *H05K 2201/0187* (2013.01); *H05K 2201/09972* (2013.01); *H05K 2201/10674* (2013.01)

(56) References Cited

U.S. PATENT DOCUMENTS

| | | | | |
|---|---|---|---|---|
| 7,842,541 | B1* | 11/2010 | Rusli | H01L 23/49833 |
| | | | | 438/106 |
| 7,935,893 | B2* | 5/2011 | Tanaka | H01L 24/82 |
| | | | | 174/258 |
| 8,177,577 | B2* | 5/2012 | Takahashi | H05K 1/183 |
| | | | | 439/392 |
| 8,866,287 | B2 | 10/2014 | Teh et al. | |
| 9,159,693 | B2* | 10/2015 | Choi | H01L 24/80 |
| 2003/0170434 | A1 | 9/2003 | Suzuki et al. | |
| 2005/0253244 | A1 | 11/2005 | Chang | |
| 2011/0228464 | A1 | 9/2011 | Guzek et al. | |
| 2012/0049366 | A1 | 3/2012 | Zeng | |
| 2014/0021635 | A1 | 1/2014 | Goh et al. | |
| 2014/0091442 | A1 | 4/2014 | Cheah et al. | |
| 2014/0091474 | A1 | 4/2014 | Starkston et al. | |
| 2014/0093999 | A1 | 4/2014 | Teh et al. | |
| 2014/0159228 | A1 | 6/2014 | Teh et al. | |
| 2014/0175672 | A1 | 6/2014 | Choi | |
| 2014/0291001 | A1* | 10/2014 | Lin | H01L 23/3121 |
| | | | | 174/261 |
| 2018/0211929 | A1 | 7/2018 | Bae et al. | |
| 2018/0352658 | A1* | 12/2018 | Yang | H01L 21/6835 |
| 2019/0057915 | A1* | 2/2019 | Starkston | H01L 23/13 |
| 2019/0057937 | A1* | 2/2019 | Starkston | H01L 23/49833 |

OTHER PUBLICATIONS

International Preliminary Report on Patentability for International Patent Application No. PCT/US15/64722, dated Jun. 21, 2018.
International Search Report and Written Opinion for International Patent Application No. PCT/US15/64722, dated Aug. 18, 2016.
International Search Report and Written Opinion for International Patent Application No. PCT/US15/63761, dated Aug. 24, 2016.
Office Action for U.S. Appl. No. 15/774,221, notified Apr. 12, 2019.
Restriction Requirement for U.S. Appl. No. 15/774,221, notified on Feb. 6, 2019.
Final Office Action for U.S. Appl. No. 15/774,221, notified Sep. 26, 2019.
Non-Final Office Action for U.S. Appl. No. 15/774,221, notified Jan. 23, 2020.
Search Report for Taiwan Patent Application No. 105134427, dated Jan. 14, 2020.
Search Report for Taiwan Patent Application No. 105133413, dated Apr. 16, 2020.

* cited by examiner

HYBRID MICROELECTRONIC SUBSTRATE AND METHODS FOR FABRICATING THE SAME

CLAIM OF PRIORITY

This Application is a National Stage Entry of, and claims priority to, PCT Application No. PCT/US15/63761, filed on Dec. 3, 2015 and entitled "A HYBRID MICROELECTRONIC SUBSTRATE AND METHODS FOR FABRICATING THE SAME", which is incorporated by reference in its entirety for all purposes.

TECHNICAL FIELD

Embodiments of the present description generally relate to the field of microelectronic substrates, and, more particularly, to the fabricating a hybrid microelectronic substrate comprising an embedded high density microelectronic patch substrate within a lower density microelectronic substrate.

BACKGROUND

The microelectronic industry is continually striving to produce ever faster and smaller microelectronic devices for use in various electronic products, including, but not limited to portable products, such as portable computers, digital cameras, electronic tablets, cellular phones, wearable electronics, applications for the Internet of Things, and the like. As the size of the microelectronic devices is reduced, it becomes more difficult to attach these microelectronic devices to microelectronic substrates in order to form electrical interconnections between various components.

One solution for the attachment issue would be to fabricate the microelectronic substrate entirely with high density electrical routing, as will be understood to those skilled in the art. However, such high density electrical routing requires expensive lithography processes, which can cost between 10 times to 50 times more than standard lithography processes used for fabricating lower density substrates, such as printed circuit boards. Another solution would be to fabricate an interposer, such as a silicon interposer, to position between the microelectronic device and the microelectronic substrate. Such interposers can be used to connect the microelectronic device to the microelectronic substrate by providing electrical routes that are high density in the area of the microelectronic device and which spread or fan out through the interposer to a lower density at the microelectronic substrate. However, such interposers can reduce electrical performance and may increase the height or thickness of the resulting microelectronic structure. Therefore, there in a need to develop microelectronic substrates which can economically provide both high density and low density interconnections.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
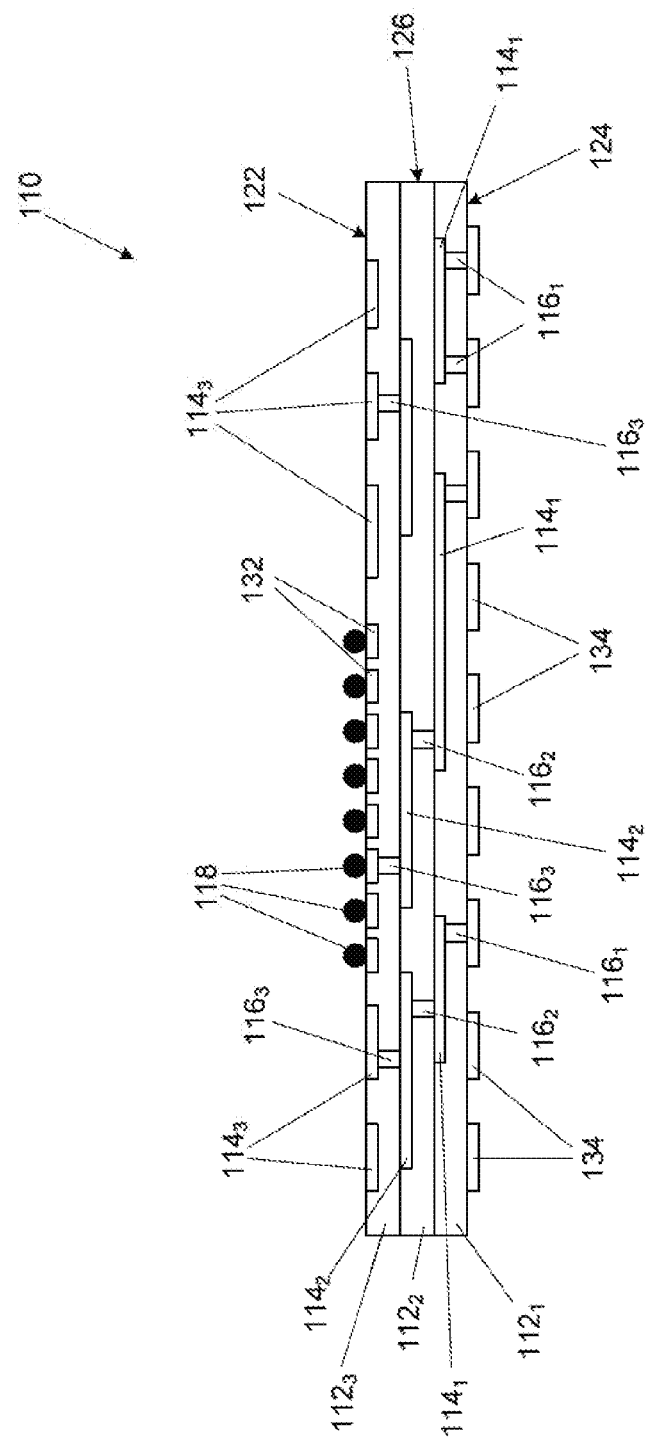
FIGS. 1-7 illustrate side cross sectional views of a method of forming a hybrid microelectronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

Embodiments of the present description include the incorporation of a high density microelectronic patch substrate within a lower density microelectronic substrate to form a hybrid microelectronic substrate. Such hybrid microelectronic substrates may allow for direct flip chip attachment of a microelectronic device having high density interconnections to the high density microelectronic patch substrate portion of the hybrid microelectronic substrate, while allowing for lower density interconnections and electrical routes in areas where high density interconnections are not required. In one embodiment, the hybrid microelectronic substrate may be formed by inserting the high density patch substrate being inserted into a recess extending in the lower density microelectronic substrate from a first surface thereof and electrically connecting the high density patch substrate with the lower density microelectronic substrate with at least one conductive blind via extending from a second surface of the lower density microelectronic substrate.

As defined for purposes of the present description, the term "lower density" in "lower density microelectronic substrate" is relative to the term "high density" in "high density microelectronic patch substrate" in that the conductive routes (i.e. the conductive traces and the conductive vias) of the lower density microelectronic substrate are larger and have a greater pitch/spacing than the conductive routes (i.e. the conductive traces and the conductive vias) of the high density microelectronic patch substrate, and vice versa, as will be discussed. Further, it is understood that the term "patch substrate" refers to a microelectronic structure which merely routes power and signals for a microelectronic device and does not contain active or passive circuitry (i.e. transistors, diodes, resistors, inductors, capacitors, and the like) beyond the conductive routes.

FIGS. 1-6 illustrate a method of fabricating a hybrid microelectronic substrate, according to embodiments of the present description. As shown in FIG. 1, a high density microelectronic patch substrate 110 may be formed comprising a plurality of dielectric material layers $112_1$-$112_3$ and a plurality of conductive routes, such as conductive traces $114_1$-$114_3$ formed in or on the dielectric material layers $112_1$-$112_3$, respectively, which are connected with conductive vias $116_1$-$116_3$. The high density microelectronic patch substrate 110 may further include a plurality of bond pads 132 in or on a first surface of 122 of the high density microelectronic patch substrate 110 and a plurality of bond pads 134 in or on a second surface 124 of the high density microelectronic patch substrate 110, wherein at least one conductive route extends between at least one of the plurality of bond pads 132 in or on a first surface of 122 of the high density microelectronic patch substrate 110 and at least one of the plurality of bond pads 134 in or on a second surface 124 of the high density microelectronic patch substrate 110. The high density microelectronic patch substrate 110 may further include at least one side 126 extending between the first surface 122 and the second surface 124 of the high density microelectronic patch substrate 110.

The conductive traces $114_1$-$114_3$ and the conductive vias $116_1$-$116_3$ may be made of any appropriate conductive material, including but not limited to, metals, such as copper, silver, nickel, gold, and aluminum, alloys thereof, and the like. The dielectric material layers $112_1$-$112_3$ may be any appropriate dielectric material, including but not limited to, bismaleimine triazine resin, fire retardant grade 4 material, polyimide materials, glass reinforced epoxy matrix materials, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

As further shown in FIG. 1, a plurality of interconnect structures 118 may be formed on respective bond pads 132 in or on the first surface 122 of the high density microelectronic patch substrate 110. The interconnect structures 126 can be made of any appropriate material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys.

It is understood that although FIG. 1 illustrates a specific number of dielectric material layers and conductive routes, any appropriate number may be fabricated. The various methods for the fabrication of the dielectric material layers $112_1$-$112_3$, the conductive traces $114_1$-$114_3$, the conductive vias $116_1$-$116_3$, the bond pads 132/134, and the interconnect structures 118 are well known in the art, and for the sake of brevity and conciseness will not be described or illustrated herein.

Figure 2:
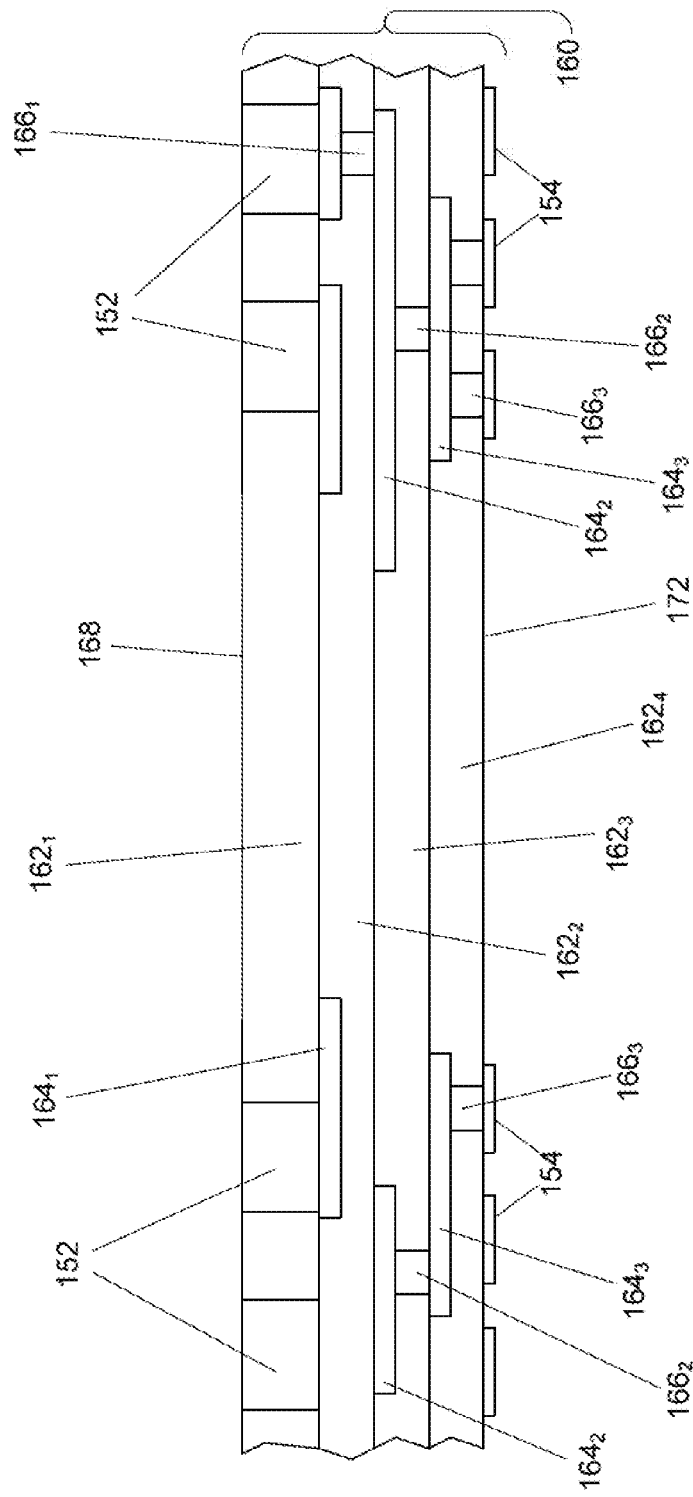

As shown in FIG. 2, a lower density microelectronic substrate 160 may be formed having a plurality of dielectric material layers $162_1$-$162_4$ and a plurality of conductive routes, such as conductive traces $164_1$-$164_3$ connected with conductive vias $166_1$-$166_3$ disposed therein. The lower density microelectronic substrate 160 may also include a plurality of top contact pads 152 formed in or on a first surface 168 of the lower density microelectronic substrate 160 and a plurality of bottom contact pads 154 may be formed in or on a second surface 172 of the lower density microelectronic substrate 160, wherein the top contact pads 152 and the bottom contact pads 152 and the bottom contact pad 154 may be electrically connected to the conductive routes.

It is understood that although FIG. 2 illustrates a specific number of dielectric material layer and conductive routes, any appropriate number may be fabricated. The various methods for the fabrication of the dielectric material layers $162_1$-$162_4$, the conductive traces $164_1$-$164_3$, the conductive vias $166_1$-$166_3$, the top contact pads 152, and the bottom contact pads 154 are well known in the art, and for the sake of brevity and conciseness will not be described or illustrated herein.

The conductive traces $164_1$-$164_3$ and the conductive vias $166_1$-$166_3$ may be made of any appropriate conductive material, including but not limited to, metals, such as copper, silver, nickel, gold, and aluminum, alloys thereof, and the like. The dielectric material layers $162_1$-$162_4$ may be any appropriate dielectric material, including but not limited to, bismaleimine triazine resin, fire retardant grade 4 material, polyimide materials, glass reinforced epoxy matrix materials, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

Figure 3:
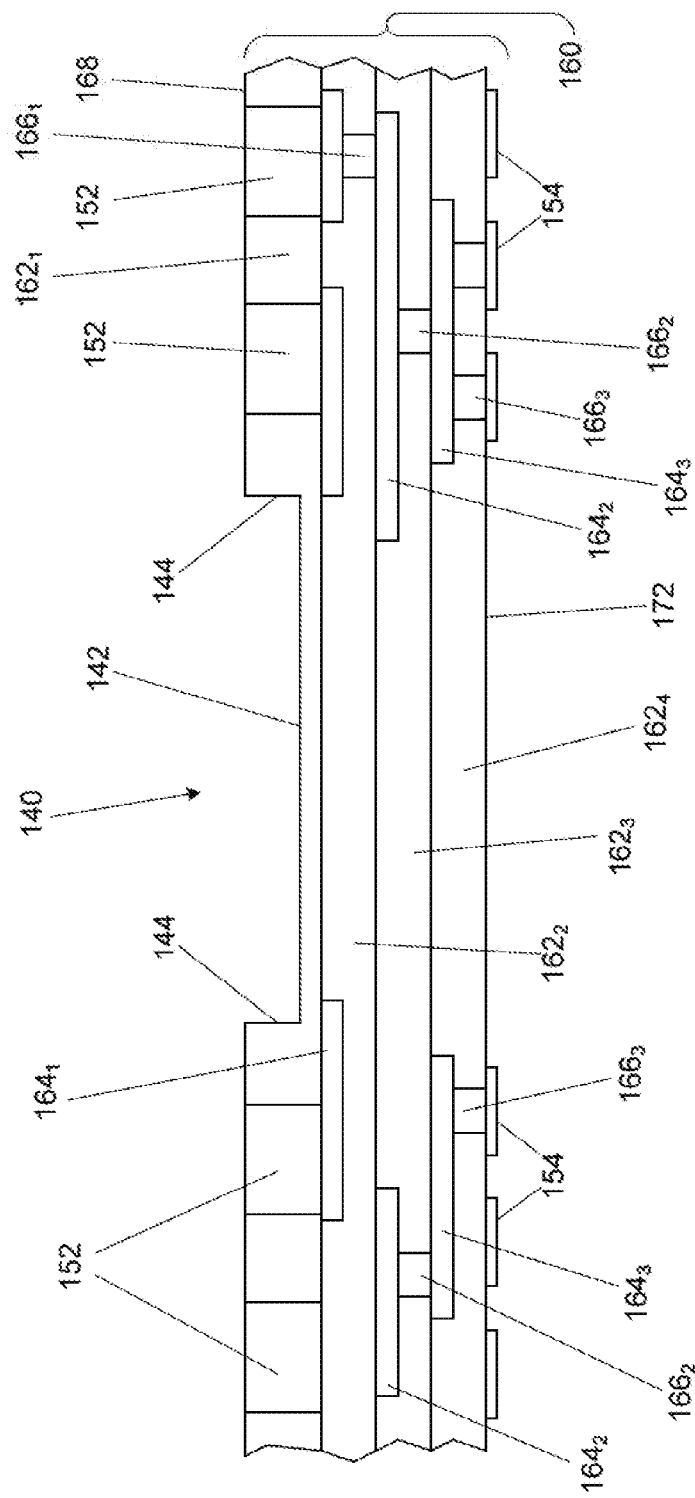
Figure 4:
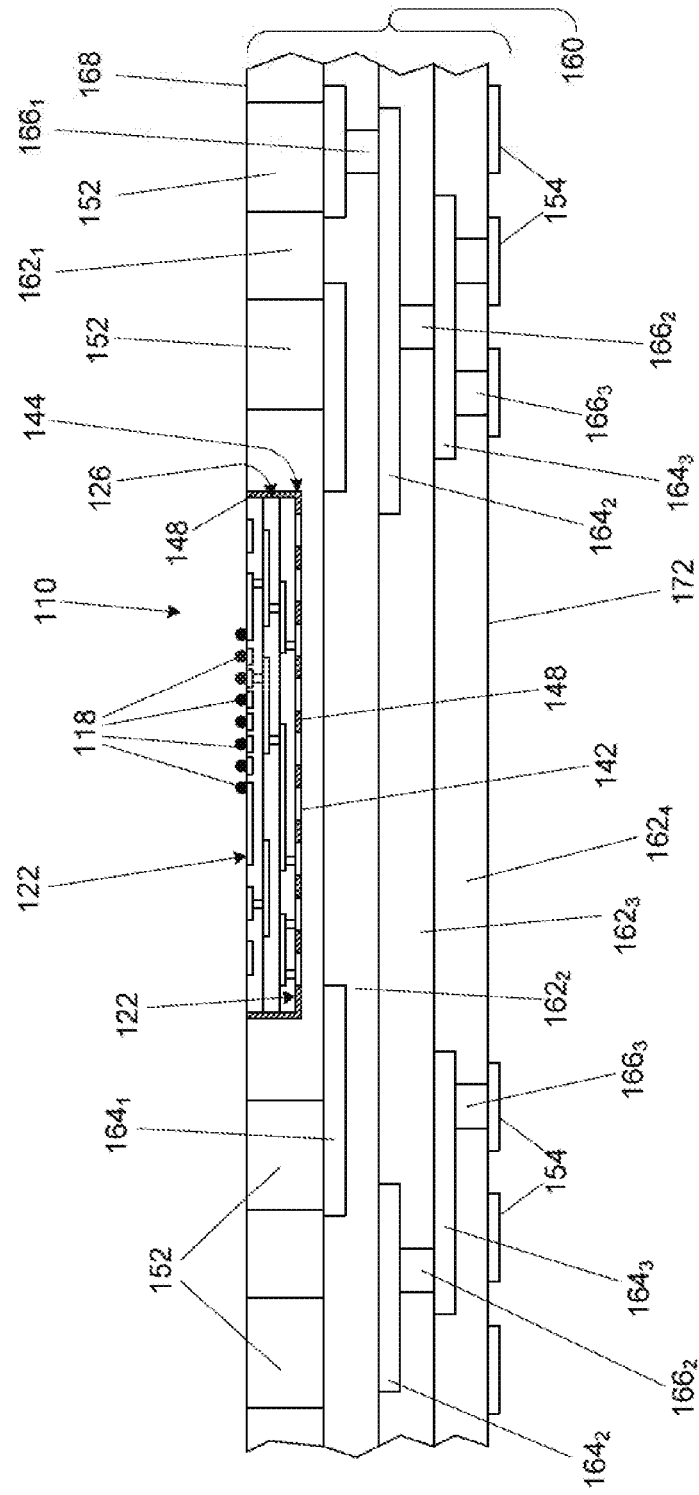

As illustrate in FIG. 3, a recess 140 may be formed to extend in the lower density microelectronic substrate 160 from the first surface 168 thereof, wherein the recess 140 is defined by a bottom surface 142 and at least one side 144. The recess 140 may be formed by any technique known in the art, including, but not limited to, laser ablation, controlled depth routing, etching, and the like. As shown in FIG. 4, the high density microelectronic patch substrate 110 may be inserted into the recess 180 and secured therein with an adhesive material 148 disposed between the second surface 126 of the high density microelectronic patch substrate 110 and a bottom surface 142 of the recess 140. In one embodiment, a portion of the adhesive material 148 may be disposed between the recess sides 144 and the high density microelectronic patch substrate sides 126.

Again, the term "lower density microelectronic substrate" is relative to the term "high density microelectronic patch substrate" in that the conductive routes (i.e. the conductive traces $164_1$-$164_3$ and the conductive vias $166_1$-$166_3$) of the lower density microelectronic substrate 160 are larger and have a greater pitch/spacing than the conductive routes (i.e. the conductive traces $114_1$-$114_3$ and the conductive vias 116₁-116₃) of the high density microelectronic patch substrate 110, and vice versa, as will be understood to those skilled in the art.

Figure 5:
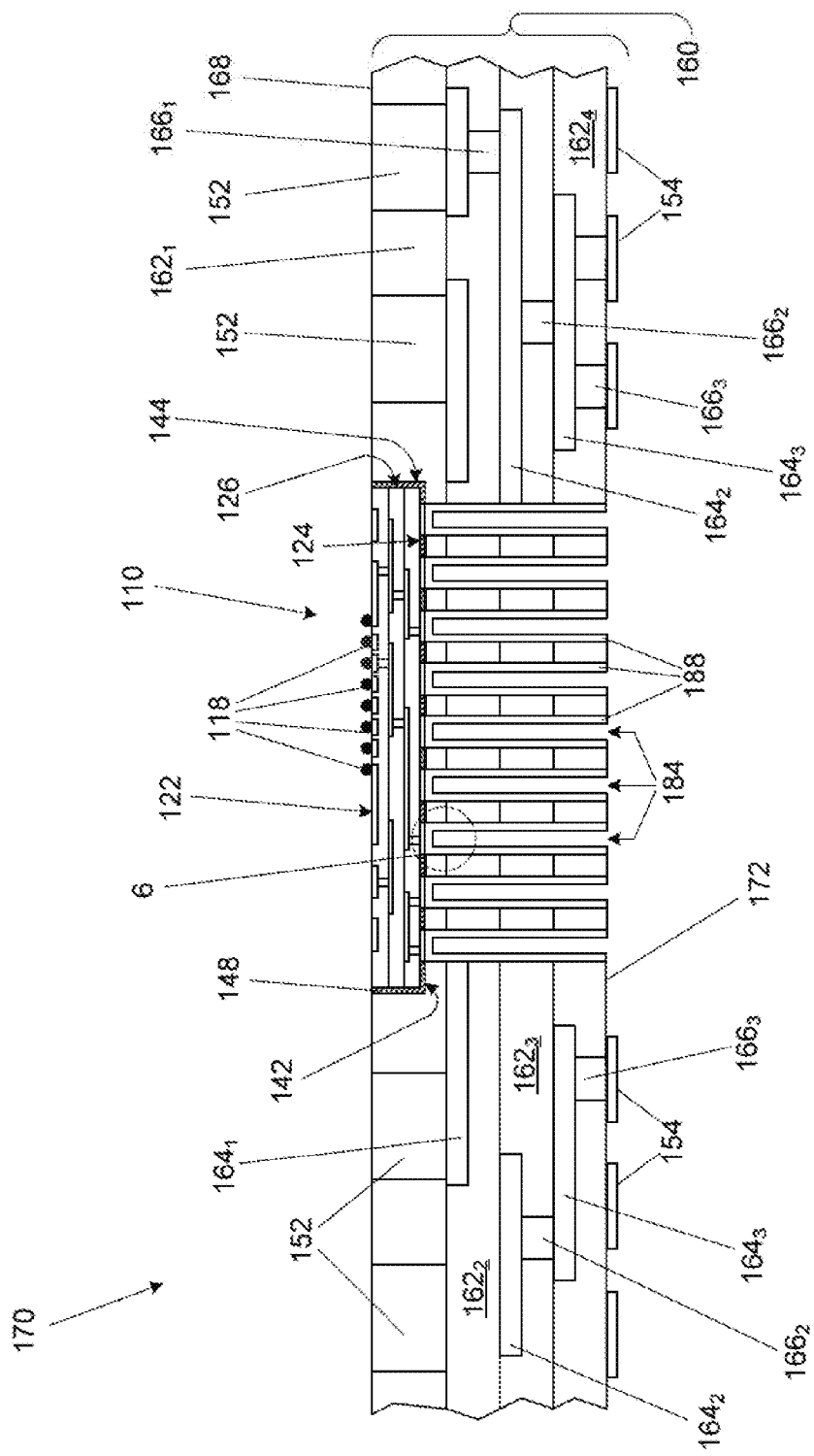
Figure 6:
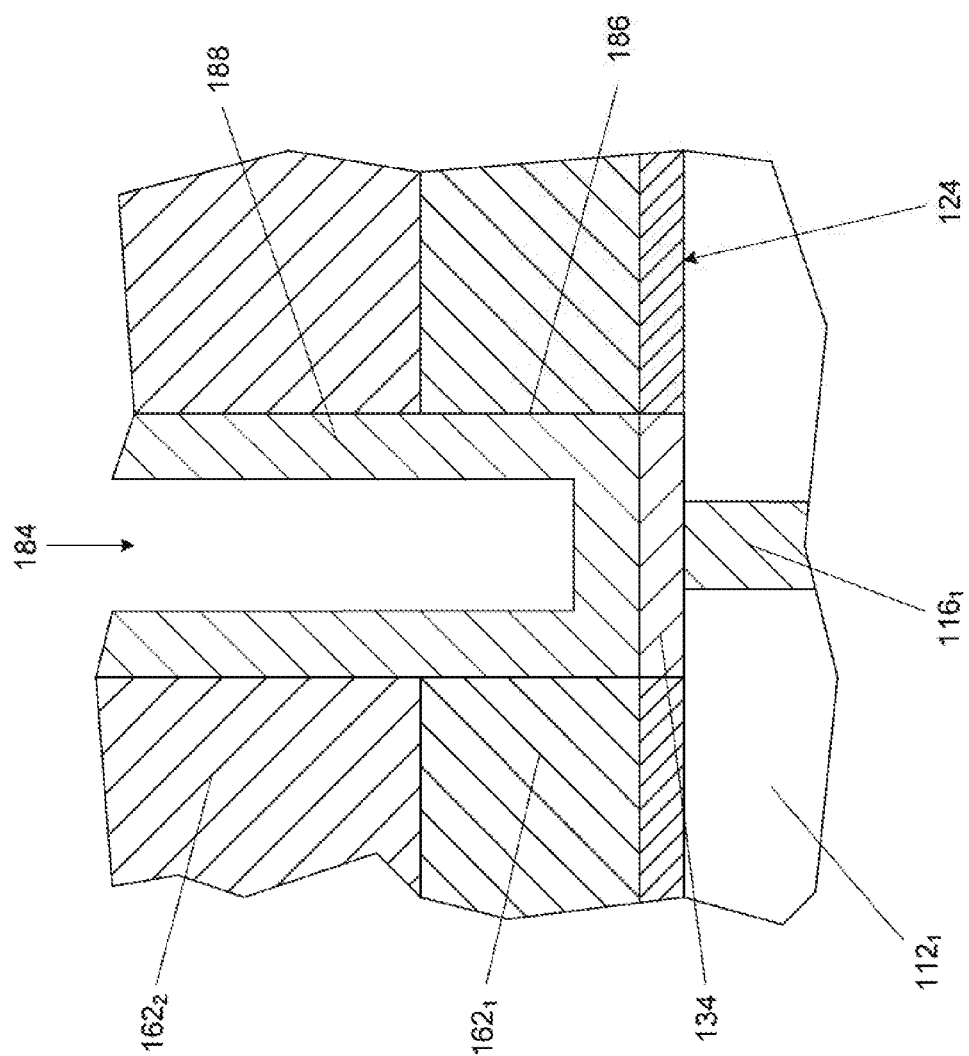

As shown in FIGS. 5 and 6 (an enlargement of area 6 of FIG. 5), at least one conductive route (i.e. conductive traces 164₁ and 164₂) of the lower density microelectronic substrate 160 may be in electrical contact with at least one of the plurality of bond pads 134 in or on a second surface 124 of the high density microelectronic patch substrate 110 through at least one electrical contact, such as at least one conductive blind via 184, which extends from the second surface 172 of the lower density microelectronic substrate 160 to at least one of the plurality of bond pads 134 in or on a second surface 124 of the high density microelectronic patch substrate 110. In one embodiment, the conductive blind vias 184 may be formed by forming vias 186 with a laser or by mechanical drilling through the dielectric material layers 162₁-162₄ to expose at least one of the plurality of bond pads 134 in or on the second surface 124 of the high density microelectronic patch substrate 110 followed by plating a conductive material 188 therein, as known in the art, wherein the conductive material 188 contacts at least one conductive route (i.e. conductive traces 164₁ and 164₂) of the lower density microelectronic substrate 160, thereby forming a hybrid microelectronic substrate 170. The various specific methods for the fabrication of the conductive blind vias 184 are well known in the art and, for the sake of brevity and conciseness, will not be described or illustrated herein.

Figure 7:
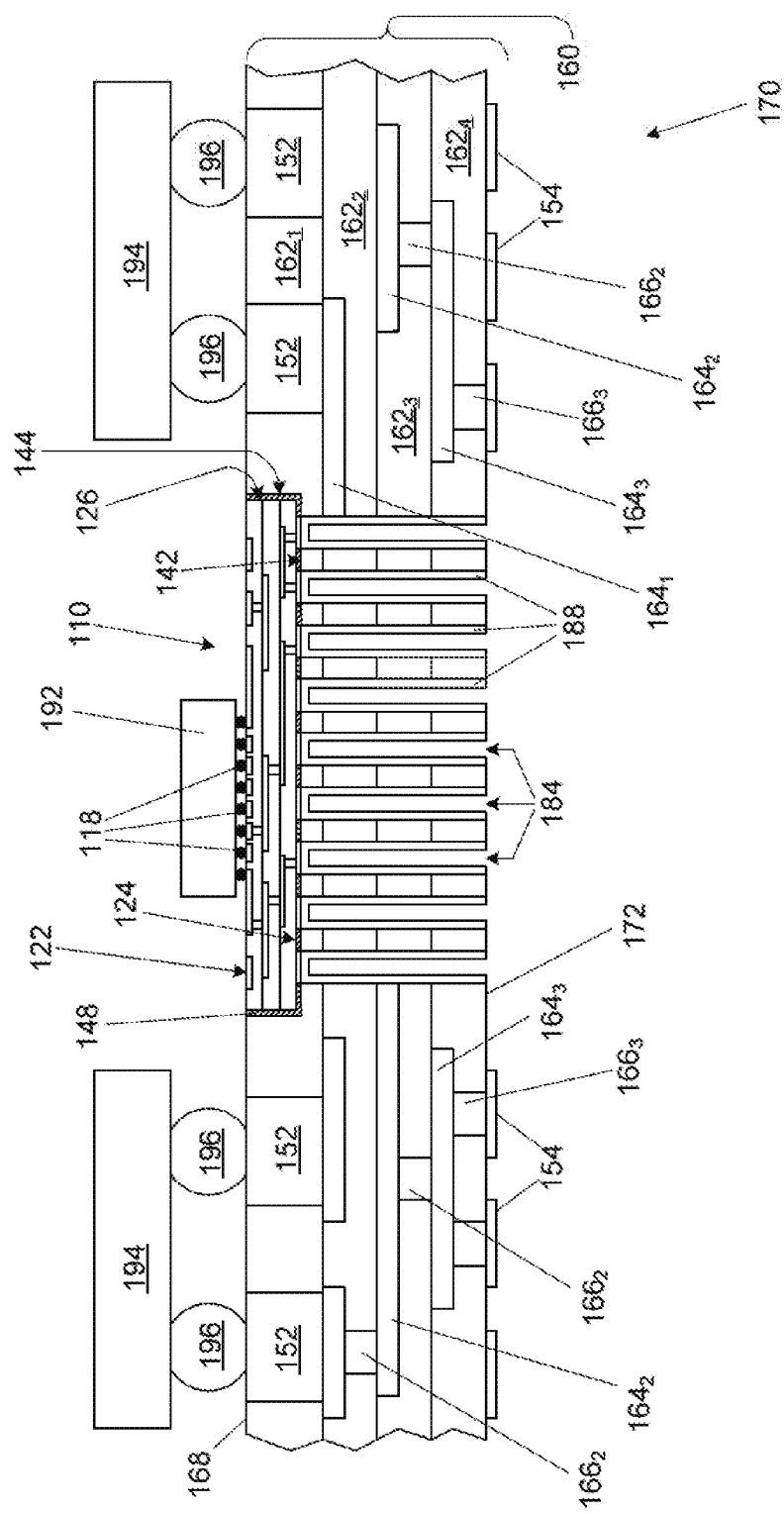

As shown in FIG. 7, at least one microelectronic device 192 may be electrically attached to the high density microelectronic patch substrate 110, such as with at least one of the plurality of interconnect structures 118. At least one additional microelectronic device 194 may be attached to at least one of the plurality of top contact pads 152, such as with at least one solder ball 196. The at least one microelectronic device 192 and the at least one additional microelectronic device 194 may be any appropriate device, including, but not limited to a microprocessor, a chipset, a graphics device, a wireless device, a memory device, an application specific integrated circuit, or the like.

In one embodiment, the plurality of dielectric material layers 112₁-112₃ of the high density microelectronic patch substrate 110 may be a different dielectric material from the dielectric material layers 162₁-162₄ of the lower density microelectronic substrate 160. In a further embodiment, the first surface 122 of the high density microelectronic patch substrate 110 may be in substantially the same plane as the first surface 168 of the lower density microelectronic substrate 160.

Figure 8:
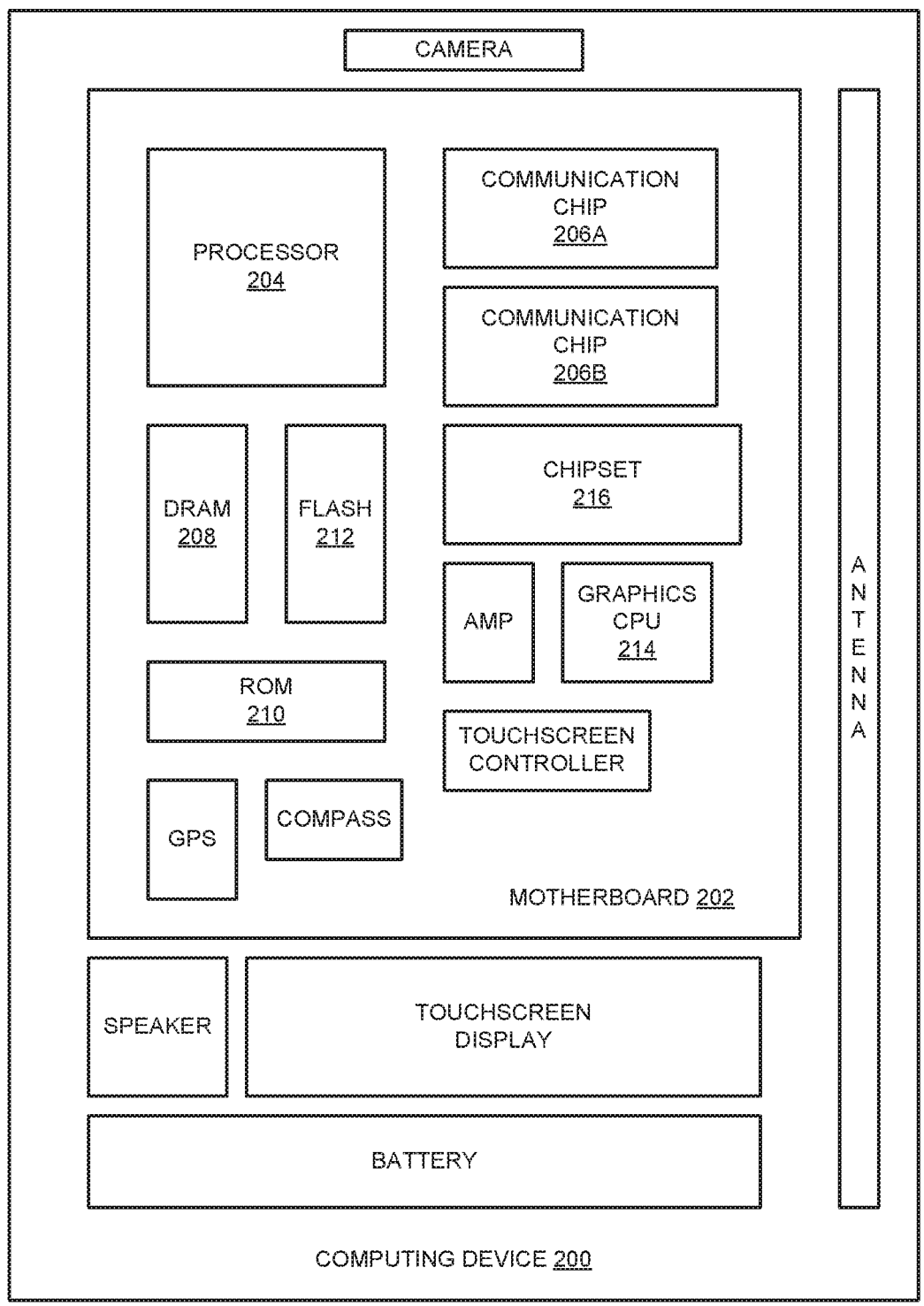
FIG. 8 illustrates a computing device in accordance with one implementation of the present description.

FIG. 8 illustrates a computing device 200 in accordance with one implementation of the present description. The computing device 200 houses a board 202. The board may include a number of microelectronic components, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 200 may include the hybrid substrate 170, as described in the present description.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other microelectronic structure and assembly applications, as will be understood to those skilled in the art.

The following examples pertain to further embodiments, wherein Example 1 is a hybrid microelectronic substrate, comprising a lower density microelectronic substrate having a first surface and an opposing second surface, and having a recess defined by at least one side and a bottom surface, wherein the recess extends into the lower density microelectronic substrate from the lower density microelectronic substrate first surface; a high density microelectronic patch substrate having a first surface, an opposing second surface, and at least one side, wherein the high density patch substrate resides within the lower density microelectronic substrate recess and is attached therein with an adhesive material disposed between the high density microelectronic patch substrate second surface and recess bottom surface of the lower density microelectronic patch substrate; and at least one conductive blind via extending from the second surface of the lower density microelectronic substrate to the second surface of the high density microelectronic patch substrate, wherein at least one of a plurality of conductive routes within the lower density microelectronic substrate is in electrical contact with at least one of a plurality conductive routes within the high density microelectronic patch substrate with the at least one conductive blind via.

In Example 2, the subject matter of Example 1 can optionally include the first surface high density microelectronic patch substrate being substantially planar with the first surface of the lower density microelectronic substrate.

In Example 3, the subject matter of either Example 1 or 2 can optionally include the adhesive material further extending between the at least one side of the high density microelectronic patch substrate and the at least one recess side of the lower density microelectronic patch substrate.

In Example 4, the subject matter of either Example 1 or 2 can optionally include the high density microelectronic patch substrate further including a plurality of bond pads in or on the first surface of the high density microelectronic patch substrate and a plurality of bond pads in or on the second surface of the high density microelectronic patch substrate, and wherein at least one of the plurality conductive routes within the high density microelectronic patch substrate extends between one of the plurality of bond pads in or on the first surface of the high density microelectronic patch substrate and one of the plurality of bond pads in or on the second surface of the high density microelectronic patch substrate.

In Example 5, the subject matter of either Example 1 or 2 can optionally include the high density microelectronic patch substrate further including a plurality of dielectric material layers, wherein the lower density microelectronic substrate includes a plurality of dielectric material layers, and wherein the plurality of dielectric material layers of the high density microelectronic patch substrate is a different dielectric material from the dielectric material layers of the lower density microelectronic substrate.

In Example 6, the subject matter of either Example 1 or 2 can optionally include the lower density microelectronic substrate including at least one top contact pad formed in or on the first surface of the lower density microelectronic substrate, wherein the at least one top contact pad is in electrical contact with at least one of the plurality of conductive routes within the lower density microelectronic substrate.

In Example 7, the subject matter of either Example 1 or 2 can optionally include the lower density microelectronic substrate including at least one bottom contact pad formed in or on the second surface of the lower density microelectronic substrate, wherein the at least one bottom contact pad is in electrical contact with at least one of the plurality of conductive routes within the lower density microelectronic substrate.

The following examples pertain to further embodiments, wherein Example 8 is a method of forming a hybrid microelectronic substrate, comprising forming a high density microelectronic patch substrate having a first surface, an opposing second surface, and at least one side; forming a lower density microelectronic substrate having a first surface and an opposing second surface; forming a recess extending into the lower density microelectronic substrate from the lower density microelectronic substrate first surface, wherein the recess is defined by at least one side and a bottom surface; attaching the second surface of the high density microelectronic patch substrate to the bottom surface of the recess of the lower density microelectronic substrate with an adhesive material; and forming at least one conductive blind via extending from the second surface of the lower density microelectronic substrate to the second surface of the high density microelectronic patch substrate to electrical connect at least one conductive route of the lower density microelectronic substrate to the high density microelectronic patch substrate.

In Example 9, the subject matter of Example 8 can optionally include attaching the second surface of the high density microelectronic patch substrate to the bottom surface of the recess of the lower density microelectronic substrate with an adhesive material results in the first surface high density microelectronic patch substrate being substantially planar with the first surface of the lower density microelectronic substrate.

In Example 10, the subject matter of either Examples 8 or 9 can optionally include the adhesive material further extending between the at least one side of the high density microelectronic patch substrate and the at least one recess side of the lower density microelectronic patch substrate.

In Example 11, the subject matter of either Example 8 or 9 can optionally include forming the high density microelectronic patch substrate further includes forming a plurality of bond pads in or on the first surface of the high density microelectronic patch substrate and a plurality of bond pads in or on the second surface of the high density microelectronic patch substrate, and forming at least one of the plurality conductive route within the high density microelectronic patch substrate extending between one of the plurality of bond pads in or on the first surface of the high density microelectronic patch substrate and one of the plurality of bond pads in or on the second surface of the high density microelectronic patch substrate.

In Example 12, the subject matter of either Example 8 or 9 can optionally include forming the high density microelectronic patch substrate further includes forming a plurality of dielectric material layers, wherein forming the lower density microelectronic substrate includes a plurality of dielectric material layers, and wherein the plurality of dielectric material layers of the high density microelectronic patch substrate is a different dielectric material from the dielectric material layers of the lower density microelectronic substrate.

In Example 13, the subject matter of either Example 8 or 9 can optionally include forming the lower density microelectronic substrate includes forming at least one top contact pad formed in or on the first dielectric material layer, wherein the at least one top contact pad is in electrical contact with at least one of the plurality of conductive routes within the lower density microelectronic substrate.

In Example 14, the subject matter of either Example 8 or 9 can optionally include forming the lower density microelectronic substrate includes forming at least one bottom contact pad formed in or on the second surface of the lower density microelectronic substrate, wherein the at least one bottom contact pad is in electrical contact with at least one of the plurality of conductive routes within the lower density microelectronic substrate.

In Example 15, the subject matter of either Example 8 or 9 can optionally include forming at least one conductive blind via comprises forming a via extending from the second surface of the lower density microelectronic substrate to the second surface of the high density microelectronic patch substrate and plating a conductive material in the via.

The following examples pertain to further embodiments, wherein Example 16 is an electronic system, comprising a board; and a microelectronic component attached to the board, wherein at least one of the microelectronic component and the board, includes a hybrid microelectronic substrate, comprising a lower density microelectronic substrate having a first surface and an opposing second surface, and having a recess defined by at least one side and a bottom surface, wherein the recess extends into the lower density microelectronic substrate from the lower density microelectronic substrate first surface; a high density microelectronic patch substrate having a first surface, an opposing second surface, and at least one side, wherein the high density patch substrate resides within the lower density microelectronic substrate recess and is attached therein with an adhesive material disposed between the high density microelectronic patch substrate second surface and recess bottom surface of the lower density microelectronic patch substrate; and at least one conductive blind via extending from the second surface of the lower density microelectronic substrate to the second surface of the high density microelectronic patch substrate, wherein at least one of a plurality of conductive routes within the lower density microelectronic substrate is in electrical contact with at least one of a plurality conductive routes within the high density microelectronic patch substrate with the at least one conductive blind via.

In Example 17, the subject matter of Example 16 can optionally include the first surface high density microelectronic patch substrate being substantially planar with the first surface of the lower density microelectronic substrate.

In Example 18, the subject matter of either Example 16 or 17 can optionally include the adhesive material further extending between the at least one side of the high density microelectronic patch substrate and the at least one recess side of the lower density microelectronic patch substrate.

In Example 19, the subject matter of either Example 16 or 17 can optionally include the high density microelectronic patch substrate further including a plurality of bond pads in or on the first surface of the high density microelectronic patch substrate and a plurality of bond pads in or on the second surface of the high density microelectronic patch substrate, and wherein at least one of the plurality conductive routes within the high density microelectronic patch substrate extends between one of the plurality of bond pads in or on the first surface of the high density microelectronic patch substrate and one of the plurality of bond pads in or on the second surface of the high density microelectronic patch substrate.

In Example 20, the subject matter of either Example 16 or 17 can optionally include the high density microelectronic patch substrate further including a plurality of dielectric material layers, wherein the lower density microelectronic substrate includes a plurality of dielectric material layers, and wherein the plurality of dielectric material layers of the high density microelectronic patch substrate is a different dielectric material from the dielectric material layers of the lower density microelectronic substrate.

In Example 21, the subject matter of either Example 16 or 17 can optionally include the lower density microelectronic substrate including at least one top contact pad formed in or on the first surface of the lower density microelectronic substrate, wherein the at least one top contact pad is in electrical contact with at least one of the plurality of conductive routes within the lower density microelectronic substrate.

In Example 22, the subject matter of either Example 16 or 17 can optionally include the lower density microelectronic substrate including at least one bottom contact pad formed in or on the second surface of the lower density microelectronic substrate, wherein the at least one bottom contact pad is in electrical contact with at least one of the plurality of conductive routes within the lower density microelectronic substrate.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A hybrid microelectronic substrate, comprising:
   a lower density microelectronic substrate comprising a plurality of dielectric layers, having a first surface and an opposing second surface, and having a recess defined by at least one side and a bottom surface, wherein the recess extends into the lower density microelectronic substrate from the first surface of the lower density microelectronic substrate;
   a high density microelectronic patch substrate having a first surface, an opposing second surface, and at least one side, wherein the high density microelectronic patch substrate resides within the lower density microelectronic substrate recess and is attached therein with an adhesive material disposed between the high density microelectronic patch substrate second surface and the bottom surface of the recess of the lower density microelectronic substrate; and
   at least one conductive blind via comprising a single via extending from the second surface of the lower density microelectronic substrate entirely through at least two dielectric layers of the plurality of dielectric layers of the lower density microelectronic substrate to the bottom surface of the recess of the lower density microelectronic substrate and a conformal layer of conductive material in the via, wherein the at least one conductive blind via electrically contacts at least one conductive route of a plurality of conductive routes within the lower density microelectronic substrate, contacts at least two dielectric layers of the plurality of dielectric layers of the lower density microelectronic substrate, and contacts at least one conductive route of a plurality conductive routes within the high density microelectronic patch substrate.

2. The hybrid microelectronic substrate of claim 1, wherein the first surface of the high density microelectronic patch substrate is substantially planar with the first surface of the lower density microelectronic substrate.

3. The hybrid microelectronic substrate of claim 1, wherein the adhesive material further extends between the at least one side of the high density microelectronic patch substrate and the at least one side of the recess of the lower density microelectronic substrate.

4. The hybrid microelectronic substrate of claim 1, wherein the high density microelectronic patch substrate further includes a plurality of bond pads in or on the first surface of the high density microelectronic patch substrate and a plurality of bond pads in or on the second surface of the high density microelectronic patch substrate, and wherein at least one conductive route of the plurality conductive routes within the high density microelectronic patch substrate extends between one bond pad of the plurality of bond pads in or on the first surface of the high density microelectronic patch substrate and one bond pad of the plurality of bond pads in or on the second surface of the high density microelectronic patch substrate.

5. The hybrid microelectronic substrate of claim 1, wherein the high density microelectronic patch substrate further includes a plurality of dielectric material layers, and wherein the plurality of dielectric material layers of the high density microelectronic patch substrate is a different dielectric material from the dielectric material layers of the lower density microelectronic substrate.

6. The hybrid microelectronic substrate of claim 1, wherein the lower density microelectronic substrate includes at least one top contact pad formed in or on the first surface of the lower density microelectronic substrate, wherein the at least one top contact pad is in electrical contact with at least one conductive route of the plurality of conductive routes within the lower density microelectronic substrate.

7. The hybrid microelectronic substrate of claim 1, wherein the lower density microelectronic substrate includes at least one bottom contact pad formed in or on the second surface of the lower density microelectronic substrate, wherein the at least one bottom contact pad is in electrical contact with at least one conductive route of the plurality of conductive routes within the lower density microelectronic substrate.

8. A method of forming a hybrid microelectronic substrate, comprising:
forming a high density microelectronic patch substrate comprising a plurality of dielectric layers, having a first surface, an opposing second surface, and at least one side;
forming a lower density microelectronic substrate having a first surface and an opposing second surface;
forming a recess extending into the lower density microelectronic substrate from the lower density microelectronic substrate first surface, wherein the recess is defined by at least one side and a bottom surface;
attaching the second surface of the high density microelectronic patch substrate to the bottom surface of the recess of the lower density microelectronic substrate with an adhesive material; and
forming at least one conductive blind via comprising forming a single via extending from the second surface of the lower density microelectronic substrate entirely through at least two dielectric layers of the plurality of dielectric layers of the lower density microelectronic substrate to the bottom surface of the recess of the lower density microelectronic substrate and plating a conformal layer of conductive material in the via to electrically connect at least one conductive route of the lower density microelectronic substrate to the high density microelectronic patch substrate, wherein the conformal layer of conductive material contacts at least two dielectric layers of the plurality of dielectric layers of the lower density microelectronic substrate.

9. The method of claim 8, wherein attaching the second surface of the high density microelectronic patch substrate to the bottom surface of the recess of the lower density microelectronic substrate with the adhesive material results in the first surface of the high density microelectronic patch substrate being substantially planar with the first surface of the lower density microelectronic substrate.

10. The method of claim 8, wherein the adhesive material further extends between the at least one side of the high density microelectronic patch substrate and the at least one side of the recess of the lower density microelectronic substrate.

11. The method of claim 8, wherein forming the high density microelectronic patch substrate further includes forming a plurality of bond pads in or on the first surface of the high density microelectronic patch substrate and a plurality of bond pads in or on the second surface of the high density microelectronic patch substrate, and forming at least one conductive route within the high density microelectronic patch substrate extending between one bond pad of the plurality of bond pads in or on the first surface of the high density microelectronic patch substrate and one bond pad of the plurality of bond pads in or on the second surface of the high density microelectronic patch substrate.

12. The method of claim 8, wherein forming the high density microelectronic patch substrate further includes forming a plurality of dielectric material layers, and wherein forming the plurality of dielectric material layers of the high density microelectronic patch substrate includes forming the plurality of dielectric material layers of the high density microelectronic patch substrate from a different dielectric material than the dielectric material layers of the lower density microelectronic substrate.

13. The method of claim 8, wherein forming the lower density microelectronic substrate includes forming at least one top contact pad in or on a first dielectric material layer, wherein the at least one top contact pad is in electrical contact with the at least one conductive route within the lower density microelectronic substrate.

14. The method of claim 8, wherein forming the lower density microelectronic substrate includes forming at least one bottom contact pad in or on the second surface of the lower density microelectronic substrate, wherein the at least one bottom contact pad is in electrical contact with the at least one conductive route within the lower density microelectronic substrate.

15. An electronic system, comprising:
a board; and
a microelectronic component attached to the board, wherein at least one of the microelectronic component and the board includes a hybrid microelectronic substrate, wherein the hybrid microelectronic substrate comprises:
a lower density microelectronic substrate comprising a plurality of dielectric layers, having a first surface and an opposing second surface, and having a recess defined by at least one side and a bottom surface, wherein the recess extends into the lower density microelectronic substrate from the lower density microelectronic substrate first surface;
a high density microelectronic patch substrate having a first surface, an opposing second surface, and at least one side, wherein the high density microelectronic patch substrate resides within the lower density microelectronic substrate recess and is attached therein with an adhesive material disposed between the high density microelectronic patch substrate second surface and the bottom surface of the recess of the lower density microelectronic substrate; and
at least one conductive blind via comprising a single via extending from the second surface of the lower density microelectronic substrate entirely through at least two dielectric layers of the plurality of dielectric layers of the lower density microelectronic substrate to the bottom surface of the recess of the lower density microelectronic substrate and a conformal layer of conductive material in the via, wherein the at least one conductive blind via electrically contacts at least one conductive route of a plurality of conductive routes within the lower density microelectronic substrate, contacts at least two dielectric layers of the plurality of dielectric layers of the lower density microelectronic substrate, and contacts at least one conductive route of a plurality conductive routes within the high density microelectronic patch substrate.

16. The electronic system of claim 15, wherein the first surface of the high density microelectronic patch substrate is substantially planar with the first surface of the lower density microelectronic substrate.

17. The electronic system of claim 15, wherein the adhesive material further extends between the at least one side of the high density microelectronic patch substrate and the at least one side of the recess of the lower density microelectronic patch substrate.

18. The electronic system of claim 15, wherein the high density microelectronic patch substrate further includes a plurality of bond pads in or on the first surface of the high density microelectronic patch substrate and a plurality of bond pads in or on the second surface of the high density microelectronic patch substrate; and, wherein at least one conductive route of the plurality conductive routes within the high density microelectronic patch substrate extends between one bond pad of the plurality of bond pads in or on the first surface of the high density microelectronic patch substrate and one bond pad of the plurality of bond pads in or on the second surface of the high density microelectronic patch substrate.

19. The electronic system of claim 15, wherein the high density microelectronic patch substrate further includes a plurality of dielectric material layers, and wherein the plurality of dielectric material layers of the high density microelectronic patch substrate is a different dielectric material from the dielectric material layers of the lower density microelectronic substrate.

20. The electronic system of claim 15, wherein the lower density microelectronic substrate includes at least one bottom contact pad formed in or on the second surface of the lower density microelectronic substrate, wherein the at least one bottom contact pad is in electrical contact with at least one conductive route of the plurality of conductive routes within the lower density microelectronic substrate.

21. The electronic system of claim 15, wherein the lower density microelectronic substrate includes at least one top contact pad formed in or on the first surface of the lower density microelectronic substrate, wherein the at least one top contact pad is in electrical contact with at least one conductive route of the plurality of conductive routes within the lower density microelectronic substrate.

* * * * *